US006276596B1

(12) United States Patent
Gruber et al.

(10) Patent No.: US 6,276,596 B1
(45) Date of Patent: Aug. 21, 2001

(54) LOW TEMPERATURE SOLDER COLUMN ATTACH BY INJECTION MOLDED SOLDER AND STRUCTURE FORMED

(75) Inventors: Peter A. Gruber, Mohegan Lake; Lannie R. Bolde, New Palte, both of NY (US); Guy P. Brouillette, Canton Saefford (CA); James H. Covell, Poughkeepsie, NY (US); David Danovitch, Granby (CA); Chon C. Lei, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/649,487

(22) Filed: Aug. 28, 2000

(51) Int. Cl.[7] .............................. B23K 31/02; B23K 35/02
(52) U.S. Cl. ....................... 228/225; 228/180.22; 228/254
(58) Field of Search ................................ 228/225, 180.22, 228/180.21, 254, 56.3; 438/611, 612; 257/735, 736

(56) References Cited

U.S. PATENT DOCUMENTS

| 4,412,642 | * | 11/1983 | Fisher, Jr. . |
| 5,244,143 | * | 9/1993 | Ference et al. . |
| 5,454,159 | * | 10/1995 | Norell . |
| 5,718,361 | * | 2/1998 | Braun et al. . |
| 5,961,032 | * | 10/1999 | Covell, II et al. . |
| 6,025,649 | * | 2/2000 | DiGiacomo . |
| 6,180,504 | * | 1/2001 | Farnworth et al. . |
| 6,186,216 | * | 2/2001 | Bolde et al. . |

* cited by examiner

*Primary Examiner*—Tom Dunn
*Assistant Examiner*—Jonathan Johnson
(74) *Attorney, Agent, or Firm*—Robert M. Trepp; Randy W. Tung

(57) ABSTRACT

A method for joining a multiplicity of multi-alloy solder columns to an electronic substrate and the structure formed by such method are disclosed. In the method, a mold plate equipped with a multiplicity of cavities is first filled by an injection molded solder technique with a high temperature solder forming a multiplicity of solder columns. The mold plate is then sandwiched between an extraction plate and a transfer plate by utilizing a multiplicity of displacement means equipped in the extraction plate to displace the multiplicity of solder columns from the mold plate into a multiplicity of apertures equipped in the transfer plate. The multiplicity of cavities in the transfer plate each has a straight opening and a flared opening. The flared opening is then filled with a low temperature solder paste to encapsulate one end of the high temperature solder column. The low temperature solder paste is then reflown on top of a conductive pad on an electronic substrate at a temperature lower than the melting temperature of the high temperature solder to form a bond between the solder column and the conductive pad.

20 Claims, 5 Drawing Sheets

LOW TEMPERATURE SOLDER COLUMN ATTACH BY INJECTION MOLDED SOLDER AND STRUCTURE FORMED

FIELD OF THE INVENTION

The present invention generally relates to an electronic substrate that has solder column grid arrays formed thereon and more particularly, relates to an electronic substrate that has multi-alloy solder columns formed thereon wherein a high temperature solder is used to form the columns and a low temperature solder is used to join the columns to conductive pads on the electronic substrate.

BACKGROUND OF THE INVENTION

Solder columns grid arrays (CGA) have been used as a package in the IC industry. The high aspect ratio of the solder columns, for instance, typically 4 to 1, allows the CGA package to tolerate significant coefficient of thermal expansion (CTE) mismatches between the package and the electronic substrate. Conventionally, a high melting point solder material such as a 90Pb/10Sn solder having a 300° C. melting temperature has been used to make connections directly to a ceramic CGA package. Since the melting temperature of the high melting point solder material exceeds the processing temperature of some subsequently used materials, the process of attaching the solder columns has to be carried out in the early stage of the manufacturing process. The solder columns formed in the early stage are therefore prone to mechanical damages such as bending, flaring, etc, through the remaining manufacturing process.

More recently, a new technique of attaching the 90Pb/10Sn solder columns with a lower temperature eutectic solder, such as 37Pb/63Sn with a melting temperature of 183° C., has been developed to attach the solder columns at the end of the manufacturing process and thus, reducing the probability for damage. The lower temperature solder is applied to one end of the high temperature solder columns by means of applying a solder paste material of 37Pb/63Sn.

In the conventional process, known as column last attached solder process (CLASP), described in U.S. patent application Ser. No. 09/014,804, assigned to the common assignee of the present application, solder columns are attached at the end of the manufacturing cycle by utilizing pre-fabricated solder columns made by cutting extruded solder wire to a specific length. The conventional process is therefore extremely labor intensive since it involves a process of precision wire extrusion, wire cutting, as well as storage and packaging. The conventional process further involves the step of loading the solder columns into a graphite fixture positioned on a vibration table. The loading process is again time consuming and is prone to problems. For instance, during the wire cutting or shipping/handling, the thin solder wires, typically of 0.02 inch diameter are susceptible to mechanical damages, such as bending, etc. A bent solder column cannot be loaded into the graphite fixture.

When filling high aspect ratio, i.e. higher than 4:1, via holes on semiconductor substrates, a screen printing technique was found ineffective and an injection molded solder (IMS) technique has been developed. For instance, U.S. Pat. No. 5,244,143, assigned to the common assignee of the present invention, discloses a new method for injecting molten solder directly into a mold, i.e. a graphite solder column mold. The patent further discloses the mold release and transfer methods for achieving low temperature solder column attach by the IMS technique. An improved injection molded solder technique, i.e. a vacuum injection molding technique was disclosed in a co-pending application that was assigned to the common assignee of the present invention under Ser. No. 08/518,874 which is incorporated herein by reference in its entirety. The vacuum injection molding method utilizes a pressure differential formed between either ambient and vacuum or positive pressure and vacuum. The method is carried out by utilizing a shallow vacuum link that allows a continuing evacuation of air from via holes that have a large aspect ratio, i.e. 5:1. The vacuum link must be sufficiently shallow such that the surface tension of molten solder prevents cross-leaking during the operation. The shallow link therefore effectively choke a significant part of the full pressure differential and thus producing only partial filling of via holes that have high aspect ratios.

It is therefore an object of the present invention to provide a method for forming an array of multi-alloy solder columns on an electronic substrate that does not have the drawbacks or shortcomings of the conventional methods.

It is another object of the present invention to provide a method for forming an array of multi-alloy solder columns by first forming the solder columns with a high temperature solder and then joining the solder columns to an electronic substrate with a low temperature solder.

It is a further object of the present invention to provide a method for forming an array of multi-alloy solder columns by an injection molded solder technique wherein a high temperature molten solder is injected into a solder column mold plate equipped with a multiplicity of cavities.

It is another further object of the present invention to provide a method for joining a multiplicity of multi-alloy solder columns to an electronic substrate by utilizing an extraction plate, a mold plate and a transfer plate.

It is still another object of the present invention to provide a method for joining a multiplicity of multi-alloy solder columns to an electronic substrate by displacing a multiplicity of solder columns into a multiplicity of apertures in a transfer plate wherein the apertures are equipped with a flared opening such that a low temperature solder paste can be screen printed therein.

It is yet another object of the present invention to provide a method for joining a multiplicity of multi-alloy solder columns to an electronic substrate by forming the solder columns with a solder having a melting temperature higher than 240° C. and joining the solder columns to an electronic substrate by a solder having a melting temperature lower than 240° C.

It is still another further object of the present invention to provide an electronic substrate which has a multiplicity of solder columns electronically joined thereto that includes an electronic substrate having a multiplicity of bonding pads thereon and a multiplicity of solder columns each formed of a high temperature solder for bonding to the bond pads by a low temperature solder.

It is yet another further object of the present invention to provide an electronic substrate that has a multiplicity of solder columns electrically joined thereto wherein the solder columns are formed with a high temperature solder and joined to the electronic substrate with a low temperature solder.

SUMMARY OF THE INVENTION

In accordance with the present invention, a method for joining a multiplicity of multi-alloy solder columns to an electronic substrate and the structures formed are disclosed.

In a preferred embodiment, a method for joining a multiplicity of multi-alloy solder columns to an electronic substrate can be carried out by the operating steps of first providing a mold plate that has a multiplicity of cavities, filling the multiplicity of cavities that has a first solder with a melting temperature of at least 240° C. to form a multiplicity of solder columns, providing an extraction plate equipped with a multiplicity of displacement means positioned corresponding to the positions of the multiplicity of cavities in the mold plate when the extraction plate is positioned on top of the mold plate, providing a transfer plate equipped with a multiplicity of apertures for receiving solder columns, the multiplicity of apertures each having a straight opening and a flared opening, positioning the mold plate in between and in intimate contact with the extraction plate and the transfer plate such that the multiplicity of cavities in the mold plate is aligned with both the multiplicity of displacement means in the extraction plate and the multiplicity of apertures in the transfer plate with the straight opening facing the mold plate, activating the multiplicity of the displacement means in the extraction plate to displace the multiplicity of solder columns from the mold plate into the transfer plate, filling the flared openings of the multiplicity of apertures in the transfer plate with a second solder that has a melting temperature of less than 240° C. encapsulating one end of each of the multiplicity of solder columns to form a flared end, positioning the transfer plate on top of an electronic substrate such that the flared end of each of the multiplicity of solder columns contacts one of a multiplicity of conductive pads on the electronic substrate, heating the transfer plate and the electronic substrate to a temperature not lower than the melting temperature of the second solder forming a bond between the multiplicity of solder columns and the multiplicity of conductive pads, and removing the transfer plate from the electronic substrate.

In the method for joining a multiplicity of multi-alloy solder columns to an electronic substrate, the multiplicity of displacement means may include a multiplicity of push pins for mechanically pressing on the multiplicity of solder columns situated in the mold plate to displace them from the multiplicity of cavities in the mold plate into the multiplicity of apertures in the transfer plate. The multiplicity of displacement means may further include pneumatic means for exerting air pressure on the multiplicity of solder columns situated in the mold plate to displace them from the multiplicity of cavities in the mold plate into the multiplicity of apertures in the transfer plate. The multiplicity of displacement means may further include push pins and pneumatic means for displacing the multiplicity of solder columns from the multiplicity of cavities in the mold plate into the multiplicity of apertures in the transfer plate. The multiplicity of cavities in the mold plate each has a tapered sidewall to facilitate the discharge of the multiplicity of solder columns from the multiplicity of cavities, the tapered sidewall produces a larger opening of the cavity in the surface of the mold plate to be joined to the transfer plate. The tapered sidewall may have an angle between about 1° and about 30° when measured from a vertical axis.

In the method for joining a multiplicity of multi-alloy solder columns to an electronic substrate, the extraction plate, the mold plate and the transfer plate may each be equipped with an alignment means for aligning to an adjacent plate. The method may further include the step of providing the multiplicity of cavities through a thickness of the mold plate, or the step of filling the flared openings of the multiplicity of apertures with the multiplicity of solder columns displaced therein with a solder paste by a printing technique, or the step of filling the multiplicity of cavities with a first solder by an injection molding technique. The method may further include the step of providing a first base plate as a stop juxtaposed to the transfer plate during the step of displacing the multiplicity of solder columns from the mold plate into the multiplicity of apertures in the transfer plate, or the step of providing the second base plate as a stop juxtaposed to the transfer plate during the step of filling the flared openings to prevent the multiplicity of solder columns from falling out of the transfer plate. The method may further include the step of flipping the transfer plate upside down such that it rests on the second base plate prior to the filling step, or the step of flipping the transfer plate upside down prior to the step of positioning the transfer plate on the electronic substrate. The first solder may have a melting temperature between about 240° C. and about 360° C., and preferably between about 280° C. and about 320° C. The second solder may have a melting temperature between about 120° C. and about 239° C., or preferably between about 160° C. and about 200° C. The first solder may include more lead than tin, while the second solder may include more tin than lead.

The present invention is further directed to an electronic substrate that has a multiplicity of solder columns electrically joined thereto which includes an electronic substrate that has a multiplicity of conductive pads on a top surface, and a multiplicity of solder columns each formed of a first solder electrically joined to one of the multiplicity of conductive pads by a second solder at a base portion of the solder column, the second solder has a lower melting temperature than the first solder.

In the electronic substrate that has a multiplicity of solder columns electrically joined thereto, the conductive pads are bond pads. The first solder has a melting temperature of at least 240° C., or a melting temperature between about 240° C. and about 360° C., or preferably between about 280° C. and about 320° C. The first solder contains more lead than tin. The second solder has a melting temperature of less than 240° C., or between about 120° C. and about 239° C., or preferably between about 160° C. and about 200° C. The second solder has more tin than lead. The multiplicity of solder columns each has a tapered shape with a larger cross-sectional area in the base portion. The tapered shape forms an angle between about 1° and about 30° with a vertical axis.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
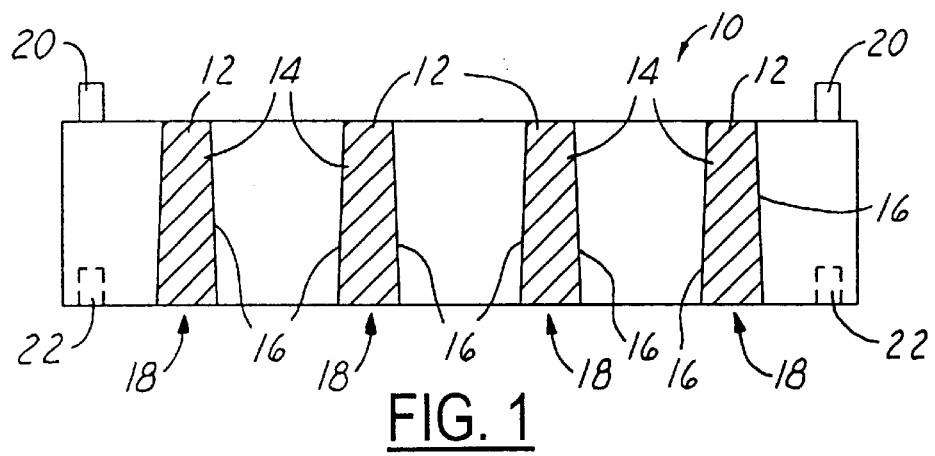
FIG. 1 is an enlarged cross-sectional view of a present invention solder column mold plate with a multiplicity of cavities filled with IMS solder.

The present invention discloses a method for joining a multiplicity of multi-alloy solder columns to an electronic substrate and structures formed by the method.

In the method, a mold plate that has a multiplicity of cavities is first filled by an injection molded solder technique of a high temperature solder material, such as one that has a melting temperature higher than 240° C. The mold plate is then positioned in between an extraction plate and a transfer plate wherein the extraction plate is equipped with a multiplicity of displacement means each corresponding to the position of one cavity, while the transfer plate is equipped with a multiplicity of apertures each corresponding to the position of the cavity in the mold plate. The displacement means is then activated by either a mechanical method, a pneumatic method, or a combined mechanical/pneumatic method to discharge the solder columns molded in the cavities into the apertures in the transfer plate. The apertures in the transfer plate have a straight end and a flared end. After the apertures are filled with the solder columns, the transfer plate is flipped upside down such that the flared openings of the apertures are facing upward for filling of a low temperature solder paste material encapsulating one end of the solder columns. The transfer plate is then flipped upside down again and positioned on an electronic substrate equipped with a multiplicity of conductive pads on a top surface such that each of the multiplicity of solder columns contacts one of the multiplicity of conductive pads. After a solder reflow process which bonds the low temperature solder, and thus the solder column formed by the high temperature solder to the conductive pad, the transfer plate is removed to exposed an electronic substrate joined with a multiplicity of solder columns on top.

A typical high temperature solder may be one that has 90Pb/10Sn that has a melting temperature of about 300° C. The word "about" used in this writing means a range of values of ±10% of the average value given. The low temperature solder material may be suitably a 37Pb/63Sn solder that has a melting temperature of about 183° C. The present invention multi-alloy solder column therefor combines the best properties of both the high temperature solder and the low temperature solder in one device. The high temperature solder used to form the solder columns presents superior heat endurance property for an IC package, while the low temperature solder presents the advantage of easy connection to an electronic substrate at a suitable low temperature.

The present invention method eliminates all the intermediate steps that is required in a CLASP process, and thus significantly simplifies the overall manufacturing process. The wire extrusion, cutting, packaging, shipping and loading steps can be encompassed within a single IMS step. In the IMS process, an injection molded solder is directly filled into a mold, which is a graphite solder column mold. The present invention method therefore focuses on disclosing the mold release and transfer methods for achieving low temperature solder column attach by IMS. The present invention method eliminates the problems and concern with the conventional CLASP method, i.e. the problem that the CLASP CGA process automation depends on a reliable means for loading solder pins into a transfer fixture, the problem that the manual CLASP method is slow and labor intensive in that average loading time per array is 80 seconds, and the problem that manual loading can further be slowed down by bent, flared, or incorrect length pins.

The present invention novel method presents numerous processing advantages. For instance, the offline casting of solder column array into mold. The method is therefore more forgiving than previous method of IMS due to elimination of concerns over mold/substrate CTE mismatch, mold contamination with flux residue, and vacuum system cross leakage. The present invention filled molds can be inspected and stocked. Casting mold material can be optimized for room temperature pin release and durability. The IMS casting equipment with pressure feed is inexpensive, such that it allows multiple casting operations ensuring continuous output. The present invention novel method further presents the benefit of enabling a rapid, automated pin array transfer. The speed of pin loading into transfer fixture is only limited by array placed in alignment time and pressed cycle speed. A further benefit made possible by the present invention is to enable fully automated pin array loading. The fixture alignment and pin transfer are reduced to a pick-and-place operation with subsequent press transfer.

The present invention novel method eliminates the dependency on pre-cut pins, length and cut tolerances, and bent pins, as well as material cost savings. For instance, the pre-cut pin cost at 1 pound weight which includes approximately 50,000 pins is about $70.00, while the cost for 1 pound bulk solder for IMS filled molds is only $10. The invention further eliminates lead/tin solder separation.

Figure 2:
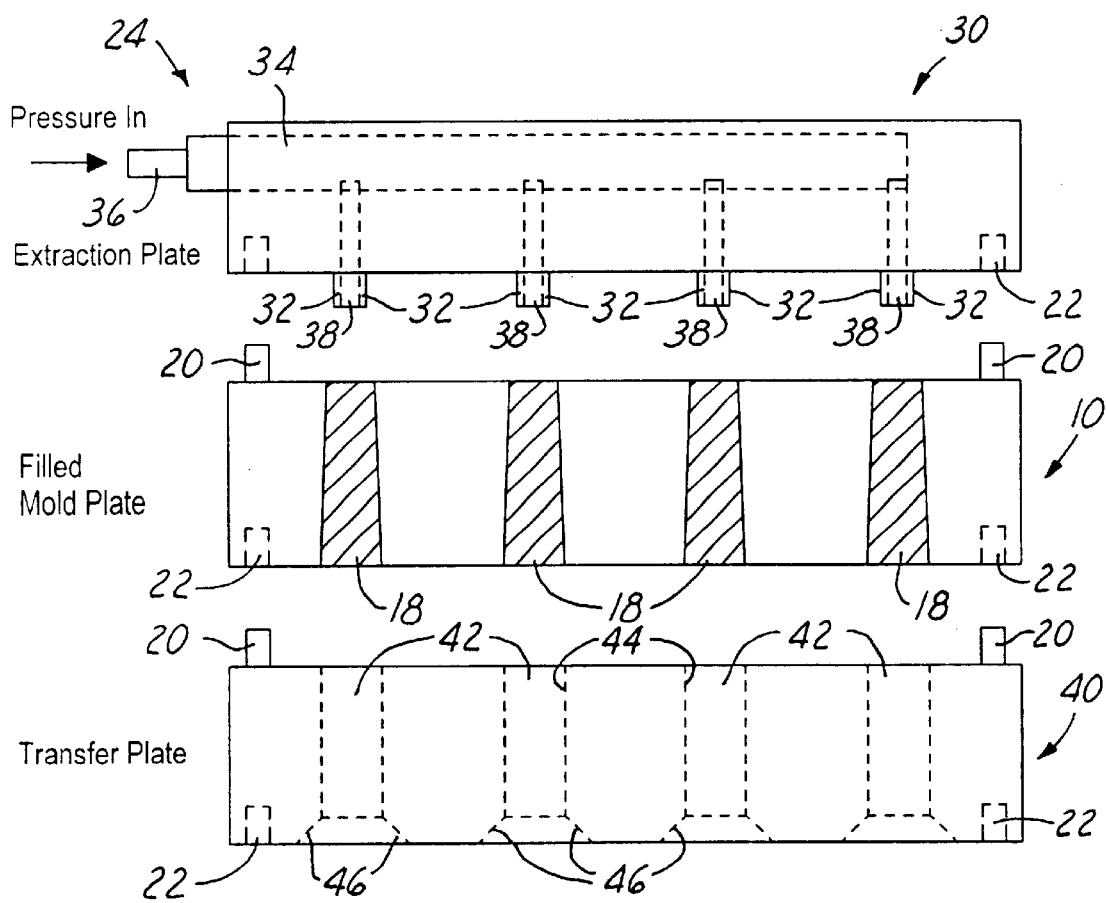
FIG. 2 are enlarged, cross-sectional view of an aligned extraction stack formed by an extraction plate, a filled mold plate and a transfer plate.

Referring initially to FIG. 1, wherein a graphite mold plate 10 is shown. The mold plate 10 is filled with solder 12 by IMS method into the multiplicity of cavities 14. The mold plate 10 contains cavities 14 that are slightly taper along a length of the side wall 16 to facilitate easy release. The taper of the side wall 16 from a vertical axis is between about 1° and about 30°, and preferably between about 2° and about 10°. The taper allows the break-away of the contact between the cavity 14 and the solder column 18 formed by the solder material 12 by a minor vertical motion. The mold plate 10 further includes alignment pins 20 and alignment holes 22 to assure accurate alignment between the mold plate 10 and a subsequently positioned extraction plate 30 and transfer plate 40 (Shown in FIG. 2).

An extraction stack 24 formed by the extraction plate 30, the mold plate 10 and the transfer plate 40 is shown in FIG.

2. The extraction plate 30 contains push pins 32 and a pressure conduit 34. The pressure conduit is used to feed a pneumatic pressure supplied from inlet 36 into apertures 38 in each of the push pins 32. The transfer plate 40 contains a multiplicity of cavities 42 for receiving the molded solder columns 18. The multiplicity of apertures 42 is each equipped with a straight end 44 and a flared end, or opening 46. The flared opening 46 is provided for receiving the application of the solder paste in a subsequent solder paste application process. It should be noted that the extraction plate 30 and the transfer plate 40 are both equipped with similar to that of the mold plate 10, alignment pins 20 and alignment holes 22.

Figure 3:
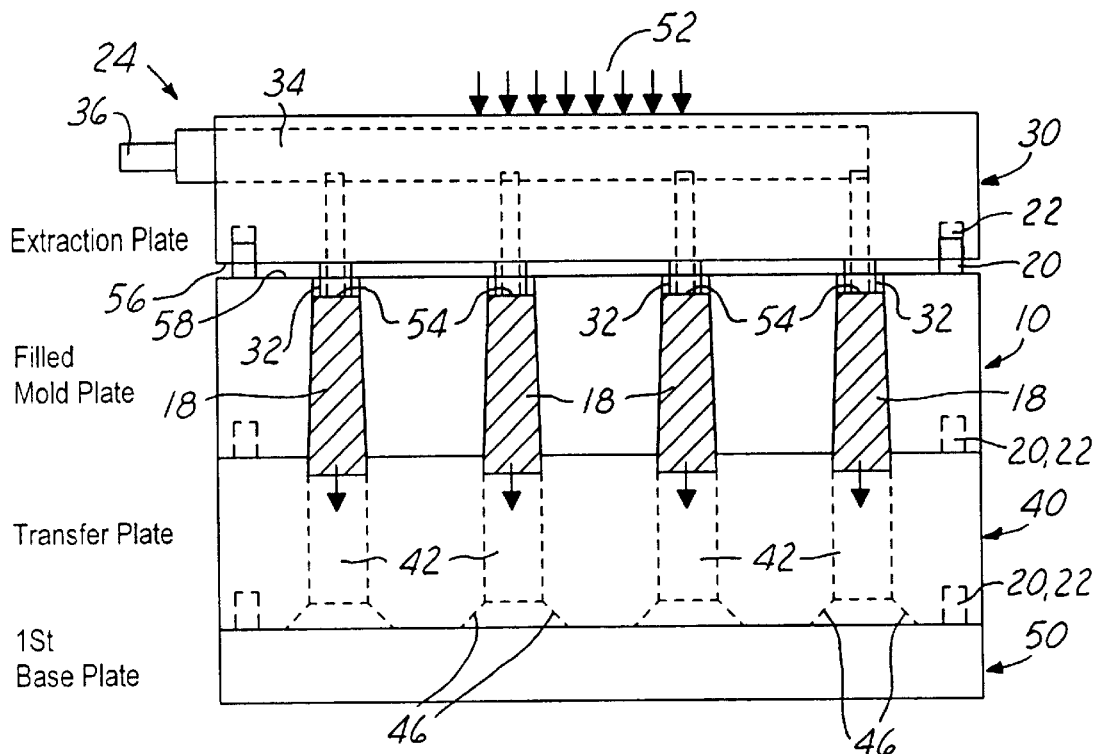
FIG. 3 is an enlarged, cross-sectional view of the extraction stack of FIG. 2 in an assembled position with the push pins pressing on the solder column, and a base plate blocking the flared openings on the transfer plate.

FIG. 3 illustrates the addition of a first base plate 50 at the bottom of the extraction stack 24 in an assembled position. The function of the first base plate 40 is to stop the advancing of solder columns 18 during the solder column displacement process. Also shown in FIG. 3 is the joined together extraction stack 24 with the alignment pins 20 engaging the alignment holes 22. As shown in FIG. 3, the extraction plate 30 applies only an initial mechanical force 52 on the top surface 54 of the solder columns 18 by means of the slightly protruding push pins 32. The source of the mechanical force 52 is applied at the top of the extraction plate 30, as shown in FIG. 3. Once the bottom surface 56 of the extraction plate 30 contacts the top surface 58 of the mold plate 10, all solder columns 18 are loosened from the mold cavities 14 due to the tapered shape of the solder columns 18. The distance that the solder columns 18 have traveled at this point is only a small fraction of their overall lengths, i.e. approximately equal to a length of the push pins of about 0.005 inch ~0.015 inch. Typically, a solder column 18 may have a length between about 0.05 inch and about 0.15 inch.

Figure 4:
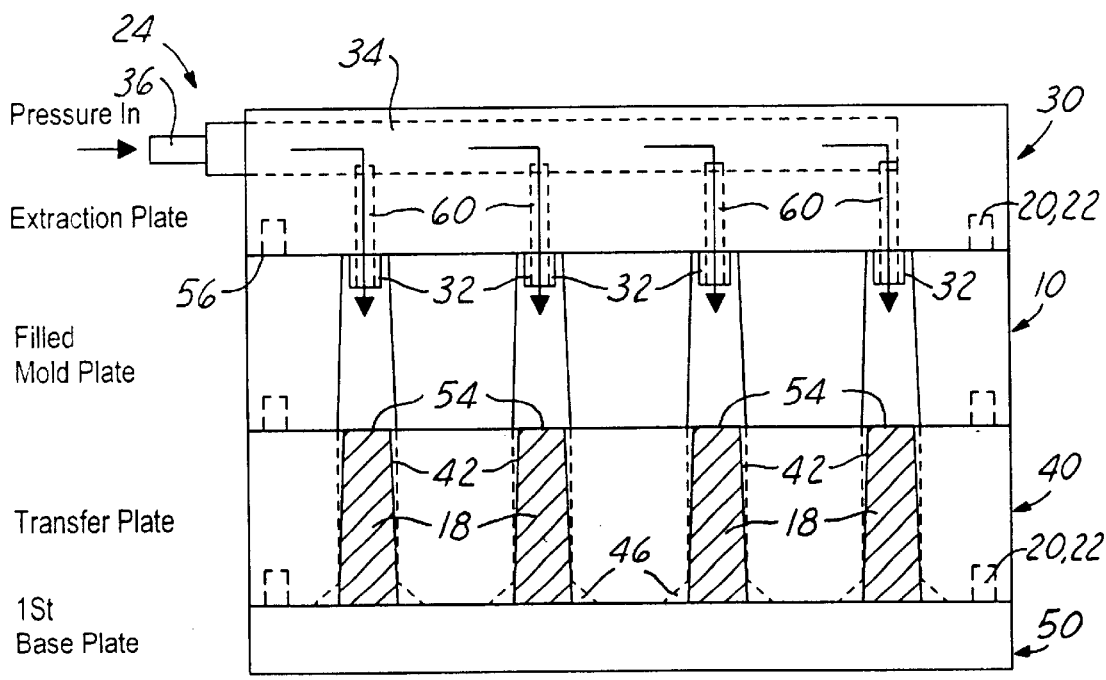
FIG. 4 is an enlarged, cross-sectional view of the extraction stack of FIG. 3 after a pneumatic force is applied and the solder columns are displaced into the multiplicity of apertures in the transfer plate.

FIG. 4 illustrates that, once the extraction plate 30 bottoms out against the mold plate 10, a pneumatic pressure is applied through the inlet 36 and the pressure conduit 34. The push pins 32 contain passageways 60 that are in full communication with the pressure conduit 34. The pneumatic pressure is thus applied to the top surfaces 54 of all the solder columns 18. Since the solder columns 18 have already been mechanically loosened, the solder columns 18 are quickly pushed into the apertures 42 of the transfer plate 40. The advancement of the solder columns 18 is stopped by the first base plate 50.

Figure 5A:
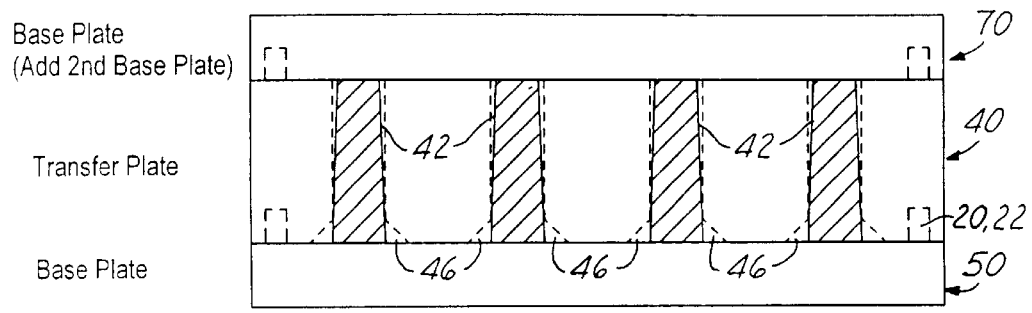
FIG. 5A is an enlarged, cross-sectional view of the filled transfer plate with a second base plate positioned on top.
Figure 5B:
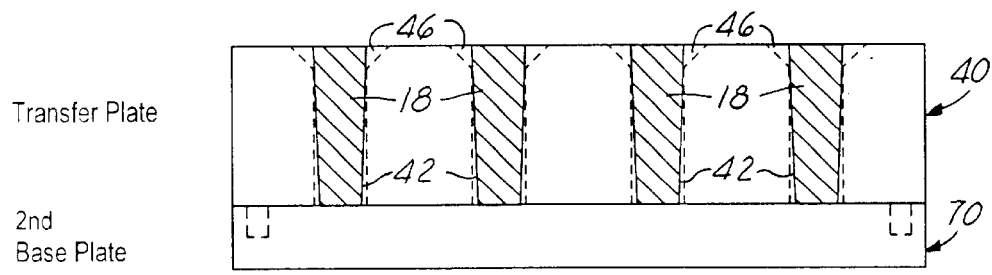
FIG. 5B is an enlarged, cross-sectional view of the transfer plate of FIG. 5A after it is flipped over on top of a second base plate.

In the next step of the process, as shown in FIG. 5A, a second base plate 70 is added to the top of the transfer plate 40 after the mold plate 10 which originally contained the solder columns 18 has been removed. The assembly is now flipped over and the first base plate 50 is removed, revealing the flared opening 46 in the apertures 42 with the solder columns 18 protruding in the middle of the flared opening 46. This is shown in FIG. 5B.

Figure 6A:
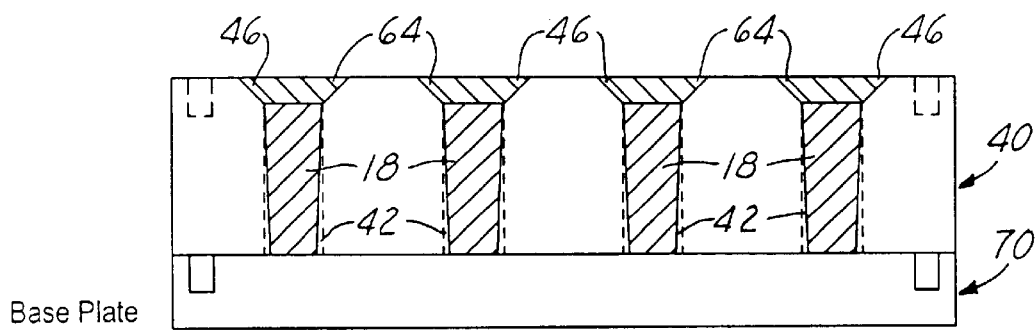
FIG. 6A is an enlarged, cross-sectional view of the transfer plate of FIG. 5B with a solder paste filled into the flared openings encapsulating the solder columns.

FIG. 6A illustrates the present invention transfer plate 40 with a low temperature solder paste 64 applied by screen printing, or any other suitable method, into the flared openings 46 for encapsulating the ends of the solder columns 18. This results in high temperature solder columns 18 capable of being attached to an electronic substrate 80 by low temperature solder paste 64, after the solder paste 64 is reflown to melt the eutectic solder and to form a metallurgical bond with the conductive pads 82 on the top surface 84 of the substrate 80.

Figure 6B:
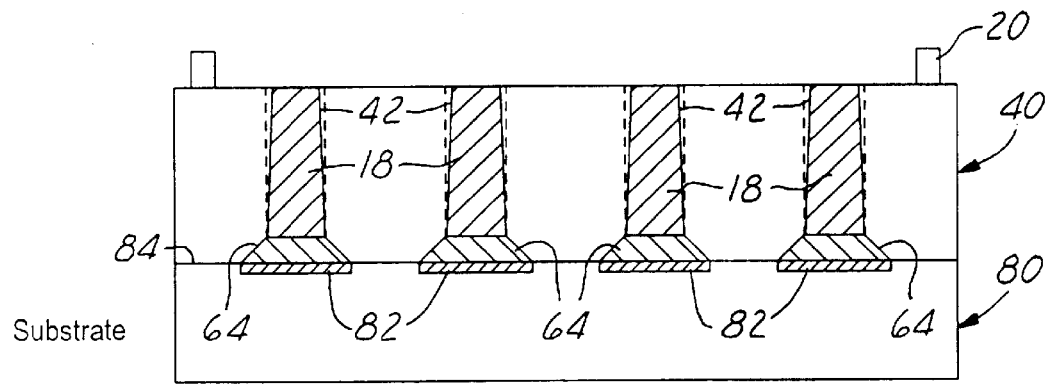
FIG. 6B is an enlarged, cross-sectional view of the transfer plate of FIG. 6A after it is flipped over and positioned on top of an electronic substrate such that the solder columns contacting the bond pads.
Figure 6C:
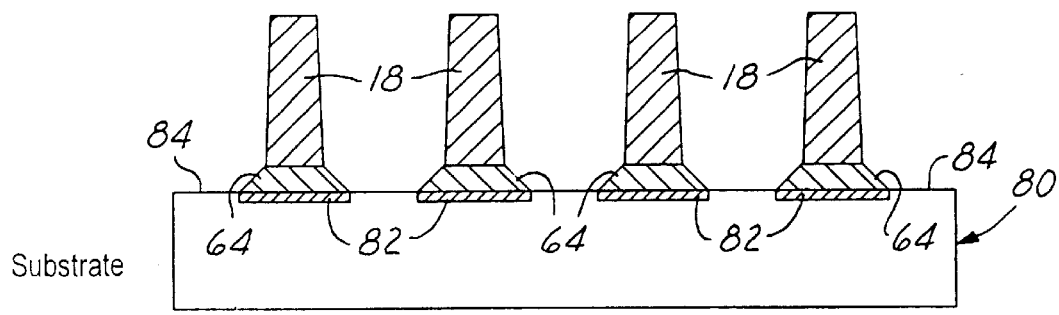
FIG. 6C is an enlarged, cross-sectional view of the electronic substrate after a solder refill process and removal of the transfer plate.

It should be noted that the transfer plate 40 is flipped over from FIG. 6A to FIG. 6B such that the flared opening 46, or the low temperature solder paste 64 are positioned juxtaposed to the conductive pads 82 located on the electronic substrate 80. The conductive pads 82 may be suitably bonding pads for solder. After the transfer plate 40 is removed from the electronic substrate 80, as shown in FIG. 6C, an electronic substrate 80 that has a multiplicity of solder columns 18 bonded to a top surface 84 is obtained. The reflow temperature for the low temperature solder 64 may be any temperature that is lower than a melting temperature of the high temperature solder, i.e. a melting temperature of 183° C. for the 37Pb/63Sn material.

Figure 9:
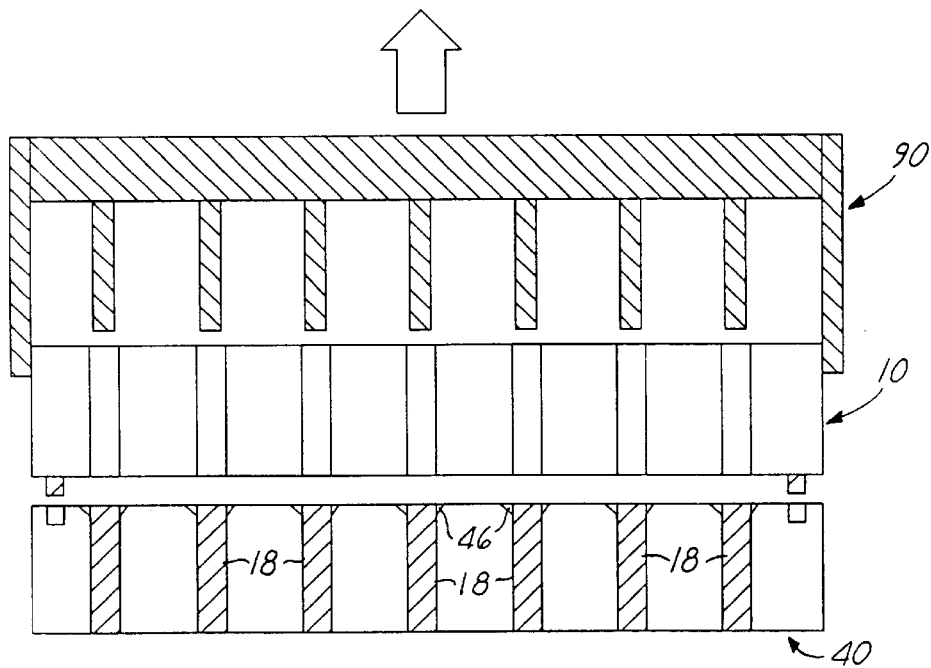
FIG. 9 is an enlarged, cross-sectional view of the present invention second preferred embodiment after the mechanical displacement means is removed from the mold plate and after the solder columns are displaced into the transfer plate.
Figure 7:
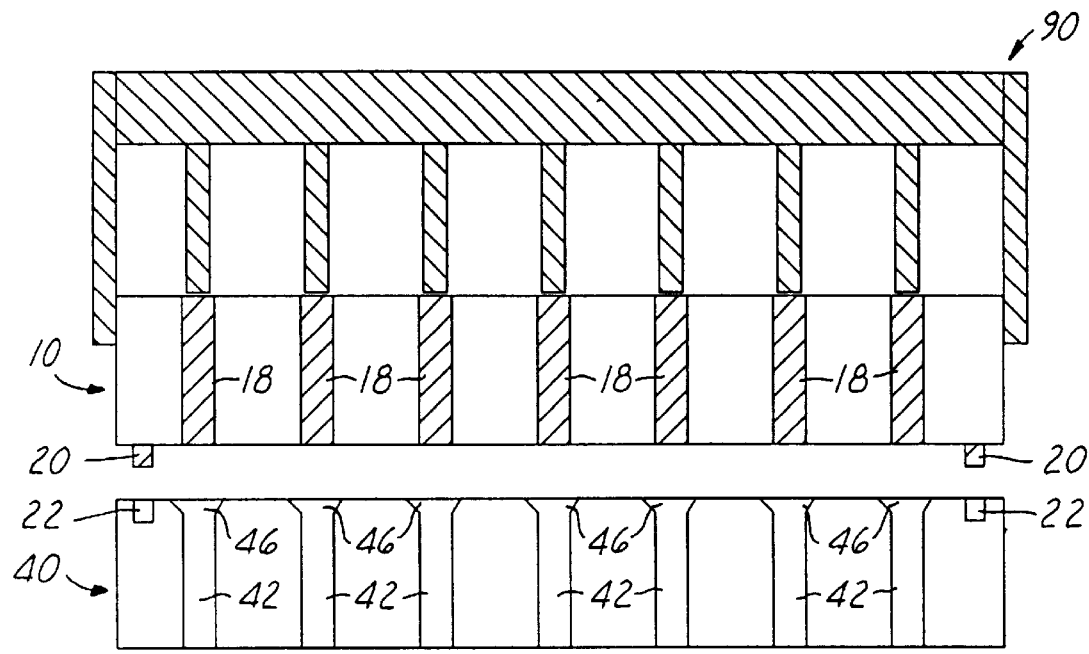
FIG. 7 is an enlarged, cross-sectional view of a second preferred embodiment of the present invention illustrating a mechanical displacement means.
Figure 8:
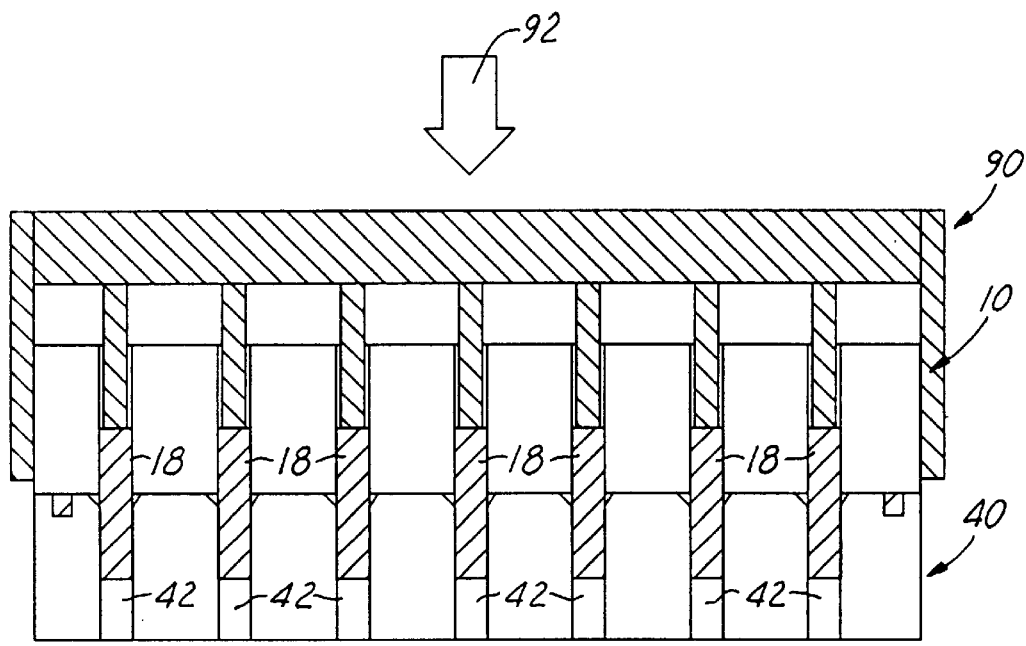
FIG. 8 is an enlarged, cross-sectional view of the present invention second preferred embodiment of FIG. 7 illustrating that the solder columns are partially pushed out of the cavities.

A second preferred embodiment of the present invention is shown in FIGS. 7, 8 and 9. As shown in FIG. 7, a one piece extraction plate 90 which is a punch/push device, i.e. a mechanical device is shown. The extraction plate 90 can be pushed down by mechanical force 92 against molded solder columns 18 situated in the mold plate 10 to displace them from the mold plate 10 into the multiplicity of apertures 42 in the transfer plate 40. It should be noted that, as shown in FIGS. 7 and 8, the second preferred embodiment of the present invention does not require the use of pneumatic force, or a high pressure air flow such as that utilized in that preferred embodiment. After the solder columns 18 are displaced into the transfer plate 40, the one piece extraction plate 90 can be removed from the mold plate 10. The transfer plate 40 can then be processed similar to the method in the preferred embodiment by filling the flared openings 46 with a low temperature solder material.

The present invention method for joining a multiplicity of multi-alloy solder columns to an electronic substrate and the structures formed have therefore been amply described in the above description and in the appended drawings of FIGS. 1–9.

While the present invention has been described in an illustrative manner, it should be understood that the terminology used is intended to be in a nature of words of description rather than of limitation.

Furthermore, while the present invention has been described in terms of two preferred embodiments, it is to be appreciated that those skilled in the art will readily apply these teachings to other possible variations of the inventions.

The embodiment of the invention in which an exclusive property or privilege is claimed are defined as follows:

What is claimed is:

1. A method for joining a multiplicity of multi-alloy solder columns to an electronic substrate comprising the steps of:

providing a mold plate having a multiplicity of cavities, filling said multiplicity of cavities with a first solder having a melting temperature of at least 240° C. forming a multiplicity of solder columns, providing an extraction plate equipped with a multiplicity of displacement means positioned corresponding to the positions of said multiplicity of cavities in said mold plate when said extraction plate is positioned on top of said mold plate, providing a transfer plate equipped with a multiplicity of apertures for receiving solder columns, said multiplicity of apertures each having a straight opening and a flared opening, positioning said mold plate in between and in intimate contact with said extraction plate and said multiplicity of apertures in said transfer plate with said straight opening facing said mold plate, activating said multiplicity of displacement means in said extraction plate to displace said multiplicity of solder columns from said mold plate into said transfer plate, filling said flared openings of said multiplicity of apertures in said transfer plate with a second solder having a melting temperature of less than 240° C. encapsulating one end of each of said multiplicity of solder columns to form a flared end, positioning said transfer plate on top of an electronic substrate, heating said transfer plate and said electronic substrate to a temperature not lower than the melting temperature of said solder forming a bond between said multiplicity of solder columns and said multiplicity of conductive pads, and removing said transfer plate from said electronic substrate.

2. A method for joining a multiplicity of multi-alloy solder columns to an electronic substrate according to claim 1, wherein said multiplicity of displacement means comprises a multiplicity of push pins for mechanically pressing on said multiplicity of solder columns situated in said mold plate to displace them from said multiplicity of cavities in said mold plate into said multiplicity of apertures in said transfer plate.

3. A method for joining a multiplicity of multi-alloy solder columns to an electronic substrate according to claim 1, wherein said multiplicity of displacement means comprises pneumatic means for exerting air pressure on said multiplicity of solder columns situated in said mold plate to displace them from said multiplicity of cavities in said mold plate into said multiplicity of apertures on said transfer plate.

4. A method for joining a multiplicity of multi-alloy solder columns to an electronic substrate according to claim 1, wherein said multiplicity of displacement means comprises push pins and pneumatic means for displacing said multiplicity of solder columns from said multiplicity of cavities in said mold plate into said multiplicity of apertures in said transfer plate.

5. A method for joining a multiplicity of multi-alloy solder columns to an electronic substrate according to claim 1, wherein said multiplicity of cavities in said mold plate each having a tapered sidewall to facilitate discharge of said multiplicity of solder columns from said multiplicity of cavities, said tapered sidewall produces a larger opening of said cavity in a surface of the mold plate to be joined to said transfer plate.

6. A method for joining a multiplicity of multi-alloy solder columns to an electronic substrate according to claim 5, wherein said tapered sidewall having an angle between about 1° and about 30° when measured from a vertical axis.

7. A method for joining a multiplicity of multi-alloy solder columns to an electronic substrate according to claim 1, wherein said extraction plate, said mold plate and said transfer plate each being equipped with an alignment means for aligning to an adjacent plate.

8. A method for joining a multiplicity of multi-alloy solder columns to an electronic substrate according to claim 1, further comprising the step of providing said multiplicity of cavities through a thickness of said mold plate.

9. A method for joining a multiplicity of multi-alloy solder columns to an electronic substrate according to claim 1 further comprising the step of filling said flared openings of said multiplicity of apertures with said multiplicity of solder columns displaced therein with a solder paste by a printing technique.

10. A method for joining a multiplicity of multi-alloy solder columns to an electronic substrate according to claim 1, further comprising the step of filling said multiplicity of cavities with a first solder by an injection molding technique.

11. A method for joining a multiplicity of multi-alloy solder columns to an electronic substrate according to claim 1, further comprising the step of providing a first base plate as a stop juxtaposed to said transfer plate during the step of displacing said multiplicity of solder columns from said mold plate into said multiplicity of apertures in said transfer plate.

12. A method for joining a multiplicity of multi-alloy solder columns to an electronic substrate according to claim 1 further comprising the step of providing a second base plate as a stop juxtaposed to said transfer plate during said step of filling said flared openings to prevent said multiplicity of solder columns from falling out of said transfer plate.

13. A method for joining a multiplicity of multi-alloy solder columns to an electronic substrate according to claim 12 further comprising the step of flipping said transfer plate upside down such that it rests on said second base plate prior to said filling step.

14. A method for joining a multiplicity of multi-alloy solder columns to an electronic substrate according to claim 1, further comprising the step of flipping said transfer plate upside down prior to the step of positioning said transfer plate on said electronic substrate.

15. A method for joining a multiplicity of multi-alloy solder columns to an electronic substrate according to claim 1, wherein said first solder having a melting temperature between about 240° C. and about 360° C.

16. A method for joining a multiplicity of multi-alloy solder columns to an electronic substrate according to claim 1, wherein said first solder having a melting temperature between about 280° C. and about 320° C.

17. A method for joining a multiplicity of multi-alloy solder columns to an electronic substrate according to claim 1, wherein said second solder having a melting temperature between about 120° C. and about 239° C.

18. A method for joining a multiplicity of multi-alloy solder columns to an electronic substrate according to claim 1, wherein said second solder having a melting temperature between about 160° C. and about 200° C.

19. A method for joining a multiplicity of multi-alloy solder columns to an electronic substrate according to claim 1, wherein said first solder comprises more lead than tin.

20. A method for joining a multiplicity of multi-alloy solder columns to an electronic substrate according to claim 1, wherein said second solder comprises more tin than lead.

* * * * *